United States Patent [19]

Coleman et al.

[11] Patent Number: 4,742,191

[45] Date of Patent: May 3, 1988

[54] KEYBOARD PROXIMITY SWITCH

[75] Inventors: William Coleman, Holliswood; Francis Albani, Floral Park, both of N.Y.

[73] Assignee: Coleman Electrical Supply Co. Inc., Brooklyn, N.Y.

[21] Appl. No.: 933,701

[22] Filed: Nov. 21, 1986

[51] Int. Cl.⁴ .......................... H02B 1/08; H01H 9/08
[52] U.S. Cl. ............................... 200/52 R; 235/145 R
[58] Field of Search ............ 200/52 R, DIG. 1, 5 R, 200/5 A, 47, 294, 295, 296, 81.4; 338/32 H; 361/288, 181, 331; 400/479.1, 479; 235/145 R

[56] References Cited

U.S. PATENT DOCUMENTS

| | | | |
|---|---|---|---|
| 3,588,875 | 6/1971 | Gabor | 200/DIG. 1 |
| 3,797,630 | 3/1974 | Zilkha | 361/388 X |
| 4,211,935 | 7/1980 | Erben | 200/81.4 X |
| 4,288,836 | 9/1981 | Thornburg et al. | 400/479.1 X |
| 4,336,529 | 6/1982 | Buan | 200/305 X |
| 4,500,758 | 2/1985 | Guckenheimer | 200/DIG. 1 |

Primary Examiner—J. R. Scott
Attorney, Agent, or Firm—Pennie & Edmonds

[57] ABSTRACT

A keyboard proximity switch having a detecting face for detecting a position of a movable key member is disclosed. An operator controlled keyboard having a plurality of movable key members is modified by the addition of a proximity switch having no moving parts for each of said movable keys, thereby greatly increasing reliability and decreasing down time.

21 Claims, 6 Drawing Sheets

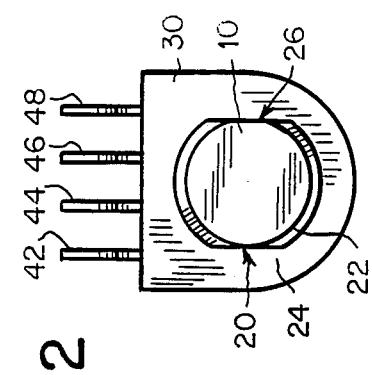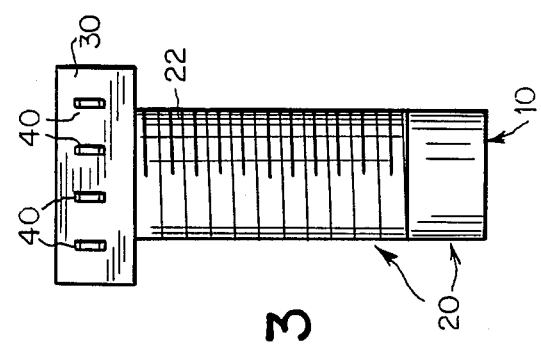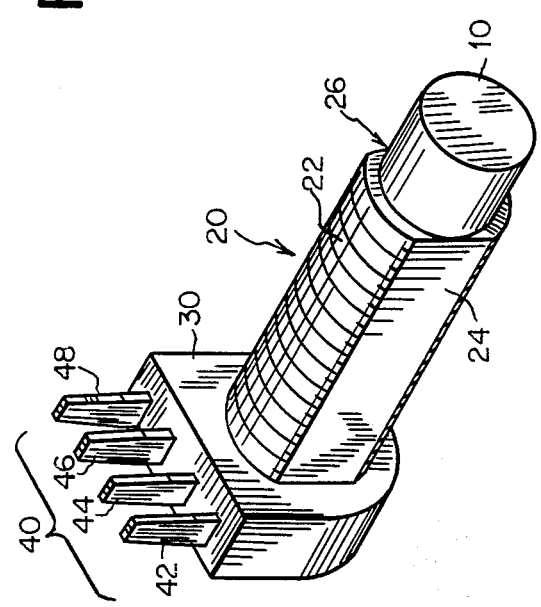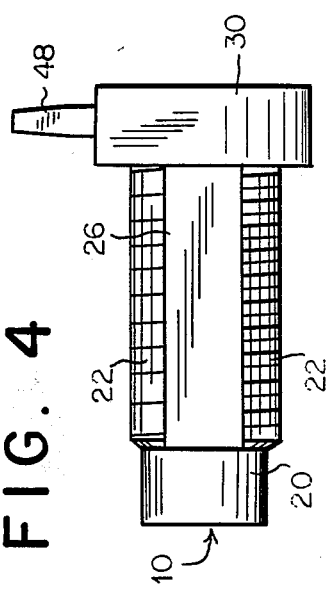

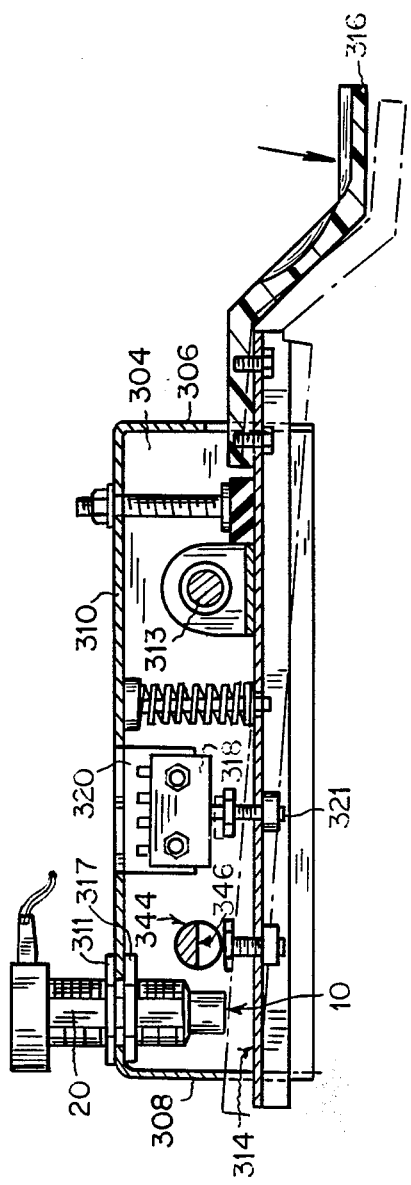

KEYBOARD PROXIMITY SWITCH

BACKGROUND OF THE INVENTION

This invention relates generally to switching mechanisms and more particularly to a proximity switch for use in United States Postal Service Multi-Position Letter Sorting Machines (MPLSMs).

It has been recognized that mechanical switches employing moving parts exhibit limited life cycles. While such a limited life cycle may be adequate for many applications due to infrequent use of the switch, relative ease of replacement or low cost, certain applications require a switch having an extended life cycle. One such application is in the area of letter sorting machines such as the MPLSM manufactured by Burroughs for use in sorting letter mail by the U.S. Postal Service. Such letter sorting machines generally have a plurality of consoles each operated by a keypunch operator. Consoles are provided with keyboards which typically comprise an upper row of ten keys and a lower row of ten keys. Each row of ten keys corresponds to digits zero through nine. The lower row of keys is generally utilized for ZIP code entry while the upper row of keys is generally utilized for prefix entry. Prefix entry typically comprises depressing a single key of the upper row of keys which corresponds to the general geographical destination of the specific letter. For example, "1" may be depressed on the upper row of keys for any destination within New York City, which generally is associated with numerous ZIP codes.

As pieces of mail are automatically brought by a mechanical arm of the MPLSM into view of the operator, the operator visually identifies a portion of the ZIP code. In a specific case of final mail sorting by MPLSMs manufactured by Burroughs the operator generally reads the last two or three digits of the ZIP code and inputs their value into the lower keyboard by depressing the corresponding keys in sequential order. For example, if the ZIP code were 11385, the operator would read "85" and depress the ninth key on the lower row of ten keys and then depress the sixth key also on the lower row of ten keys. Alternatively, the operator may enter the "8" on the lower row of keys and the "5" on the upper row of keys. In this specific case, mail arriving at the console has been presorted according to the first three digits in a five digit ZIP code.

Unfortunately, all known letter sorting machines presently in use by the U.S. Postal Service are provided with a mechanical switch of the miniature snap limit type associated with each of the twenty keys of a keyboard. The life cycle of such switches is generally on the order of one million cycles, corresponding to a mean time of failure just two months after installation. Considering that a four console machine typically contains 80 such switches, and that failure in a single switch necessitates shutting down the entire console, it is clear that a more reliable switch is desirable.

The inadequacy of mechanical switches presently used in letter sorting machines is further exemplified by the existence of approximately four regional rebuilding centers devoted largely to refitting keyboards having defective mechanical switches with new mechanical switches.

An additional deficiency of existing mechanical switches relates to the electrical phenomenon of "bounce". Upon urging a first contact in a mechanical switch into electrical contact with a second contact, a clean, single transition from one voltage level to another voltage level generally does not occur. Rather, numerous transitions will occur among various voltage levels prior to stabilization at the second level. To remedy this deficiency, existing letter sorting machines are provided with additional software programs and/or hardware to prevent the false results due to bounce. Advantageously, a system wherein such bounce does not occur would not require additional compensating hardware and/or software which increases costs and reduces reliability.

SUMMARY OF THE INVENTION

The present invention comprises a proximity switch for use in an operator controlled keyboard.

In the presently preferred embodiment, a position of an at least partially metallic movable key member in a keyboard is detected by a proximity switch having no moving parts. Movement of a metallic portion of the key member to within a predetermined distance of the proximity switch causes a first output of the proximity switch while movement of the metallic portion of the key member a predetermined distance away from the proximity switch causes a second output of the proximity switch. The output of the proximity switch corresponds to the position of the movable key.

Four terminals are provided on each of the ten proximity switches of the presently preferred embodiment, namely, a positive input terminal which is common to each of the proximity switches, a negative input terminal which is also common to each of the ten proximity switches, a normally open output terminal and a normally closed output terminal.

Incorporation of such proximity switches into existing operator controlled keyboards such as a ten key lower keyboard and a ten key upper keyboard of a letter sorting machine such as the MPLSM manufactured by Burroughs for use by the United States Postal Service has greatly increased the reliability of such machines. In addition to reducing down time of such machines, proximity switches of the presently disclosed type may be incorporated into such machines with minimum modification to the machines. Additionally, modification of a central computer to which all of the proximity switches of the keyboard are connected is not necessary.

Accordingly, it is a principle object of the present invention to provide new and improved switching devices.

A further object of the present invention is to provide a proximity switch having a higher degree of reliability than existing mechanical switches.

An additional object is to provide a plurality of proximity switches having no moving parts for use in keyboards to increase reliability and decrease down time.

A specific object is to provide a high reliability keyboard for use in sorting machines.

A more specific object is to refit existing United States Postal Service sorting machines having operator controlled keyboards with proximity switches.

An additional specific object is to provide high reliability proximity switches which replace mechanical switches in keyboards of United States Postal Service letter sorting machines with a minimum amount of modification to the existing keyboard.

BRIEF DESCRIPTION OF THE DRAWINGS

These and other objects, features and advantages of the invention will become more readily apparent with reference to the following description of the invention in which:

FIG. 1 is a perspective view of a proximity switch;

FIG. 2 is a frontal view of the proximity switch of FIG. 1;

FIG. 3 is a top view of the proximity switch of FIG. 1;

FIG. 4 is a side view of the proximity switch of FIG. 1;

FIG. 9 is a cross-sectional view along line 9—9 of FIG. 8 depicting a single key and associated mechanism of the upper keyboard as well as the proximity switch of FIG. 1.

DETAILED DESCRIPTION OF THE INVENTION

Figure 5:
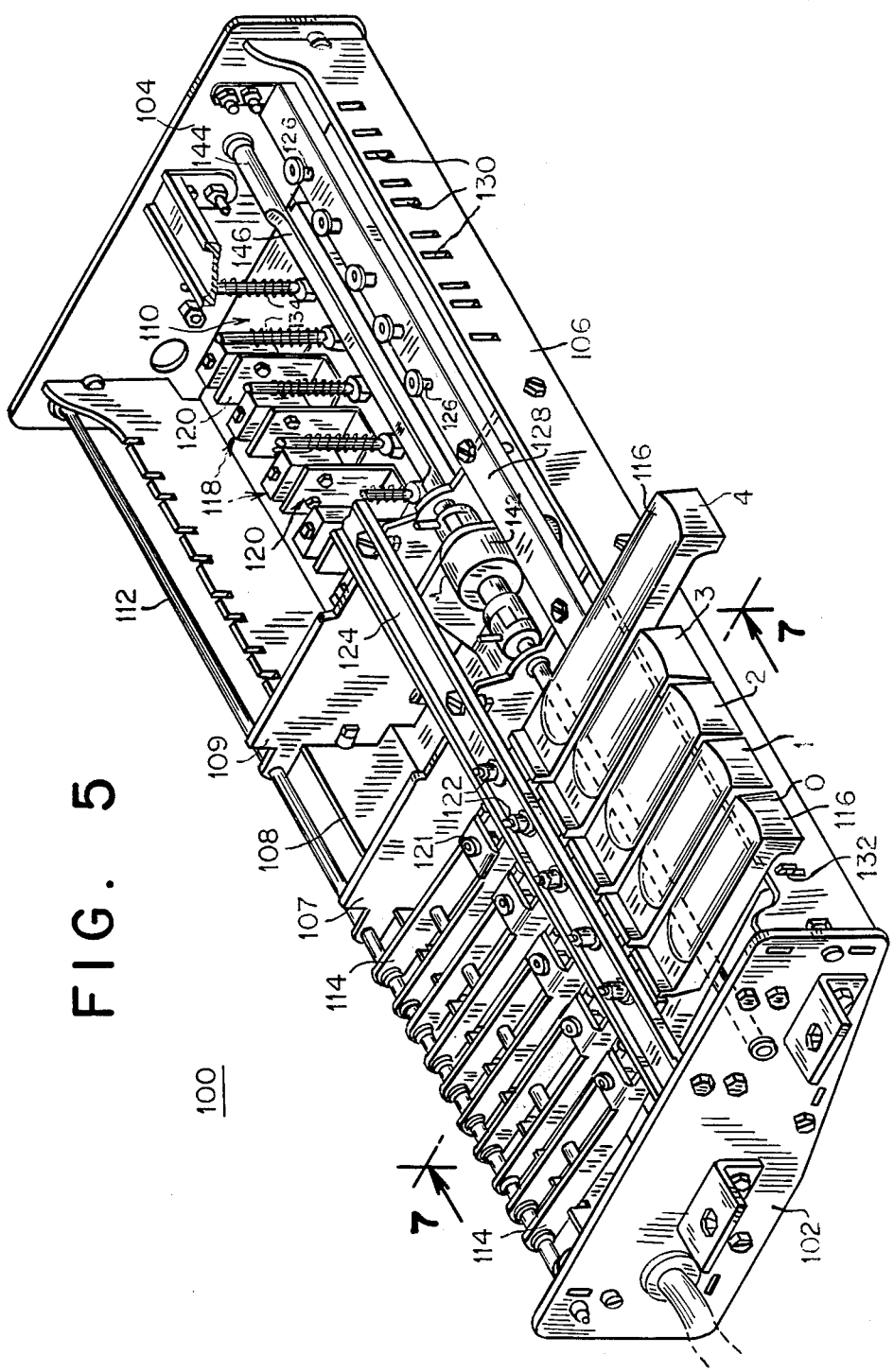
FIG. 5 is a perspective view of a known prior art lower keyboard.

Referring to FIGS. 1–4 in which common elements are labelled similarly, there is shown a preferred embodiment of a proximity switch of the present invention comprising a detecting face 10, a threaded tubular shaft 20, a base plate 30 and electrical terminals 40.

Detecting face 10 of the presently preferred embodiment is an essentially planar circular face which separates switch electronics housed by tubular shaft 20 and base plate 30 from an external metallic element whose position relative to detecting face 30 determines the output of the proximity switch. Tubular shaft 20 is provided with a threaded surface 22 to facilitate height adjustment of the proximity switch within its operating environment. Tubular shaft 20 is preferably provided with flat surfaces 24, 26 in order to facilitate mounting and prevent rotation of the proximity switch within its operating enviroment. Base plate 30 partially houses electrical terminals 40 and rigidly projects terminals 40 at a right angle to the axis of the tubular shaft 20. Electrical terminals 40 preferably comprise a positive input terminal 42, a negative input terminal 44, a normally closed output terminal 46 and a normally open output terminal 48.

Detecting face 10, tubular shaft 20 and base plate 30 serve to house the switch electronics. The switch electronics are of a complementary output type. Performance specifications of such a switch are disclosed in Table I.

TABLE I

| | |
|---|---|
| Input Voltage | 5 VDC ± .5 VDC |
| Load Current | 50 mA Max./Each Output |
| Load Configuration | N.O./N.C. Complementary; Both Sinking |
| Burden Current (Exclusive of Load) | Less than 5 mA |
| Output Leakage | Less than 10 uA |
| Saturation Voltage | Less than .6 VDC @ 50 mA |
| Operating Temperature | 0° C. to 50° C. |
| Sensing Range | 2 mm ± 10% |
| Hysteresis | 7 to 20% of sensing range over temperature range of 0 to 50° C. 10% of sensing range nominal at ambient (20° C.). |

Figure 7:
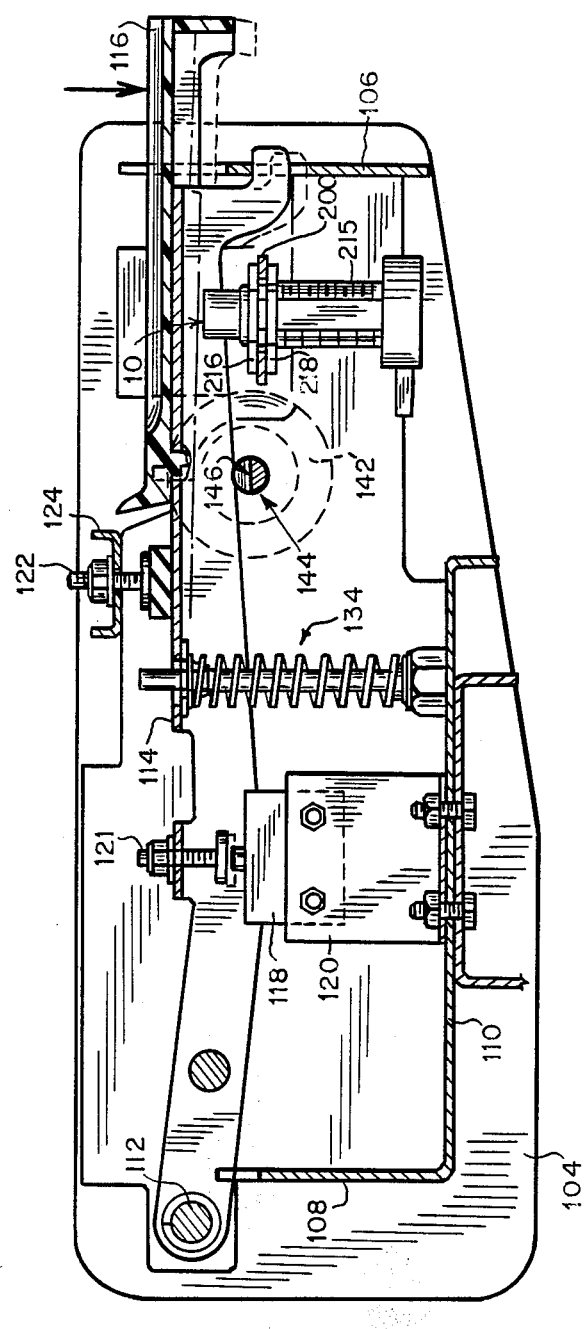
FIG. 7 is a cross-sectional view along line 7—7 of FIG. 5 depicting a single key and associated mechanism of the lower keyboard as well as the mounting bracket proximity switch combination of FIG. 6.

Approximate dimensions, in inches, of the proximity switch of FIGS. 1–4 adequate for the embodiments illustrated in FIGS. 7, 9 are as follows: Detecting face 10, diameter 0.4; tubular shaft 20, axial length 1.15; base plate housing 30, length as measured along the axis of tubular shaft 20, 0.25, overall width×height 0.7×0.7.

Referring to FIG. 5, a perspective view of a known lower keyboard 100 is shown comprising left side bracket 102, right side bracket 104, front bracket 106, rear bracket 108, center brackets 107, 109 and base housing 110. Movable keys 0–9 are pivotally attached to pivot rod 112 which is rigidly attached to brackets 102, 104. Movable keys 0–9 (5–9 not shown) each comprises a metallic key support 114 pivotally attached to pivot rod 112 and a plastic key covering 116 attached to a portion of the front upper surface of metallic key support 114. Mechanical switches 118 of the miniature snap limit type are rigidly attached to base housing 110 by switch supports 120. Adjustment of contact position of mechanical switches 118 in order to alter the point of depression of the movable keys which engages mechanical switches 118 is accomplished through adjustment of set screws 121. Adjustment of set screws 122 mounted on support bracket 124 serve to limit upward travel of the movable keys, while adjustment of set screws 126 mounted on support bracket 128 serve to limit downward travel of the movable keys. Additionally, vertical slots 130 in front bracket 106 through which a tab portion 132 of metallic key support 114 extends, serves to limit upward as well as downward travel of the movable keys. Spring assemblies 134 exert an upward force against metallic key supports 114 to provide for a normally upward position of the movable keys.

Lock-out mechanism 140 comprises a motor 142 and rod 144. Rod 144 is provided with a semicircular cross-section in a region proximate to and facing the underside of the movable keys. During normal operation of the keyboard, i.e., when an operator depresses keys in accordance with entry of the ZIP code of a letter, a flat surface 146 of rod 144 faces the under side of the movable keys and serves to limit downward movement of the keys a maximum desired distance sufficient to actuate mechanical switches 118. Once the desired number of digits have been entered into the keyboard a control signal is sent (by means not shown) to motor 142 which rotates rod 144 approximately 45°–90°, thereby preventing or further limiting downward movement of the keys a desired distance insufficient to actuate mechanical switches 118 and thereby preventing inadvertent operator input. In a process wherein letters are sorted on the last two digits of the ZIP code, the lock-out mechanism will engage after two digits are entered into the keyboard(s). The lock-out mechanism will generally disengage upon removal of the sorted letter and delivery of a next letter to be sorted.

Figure 6:
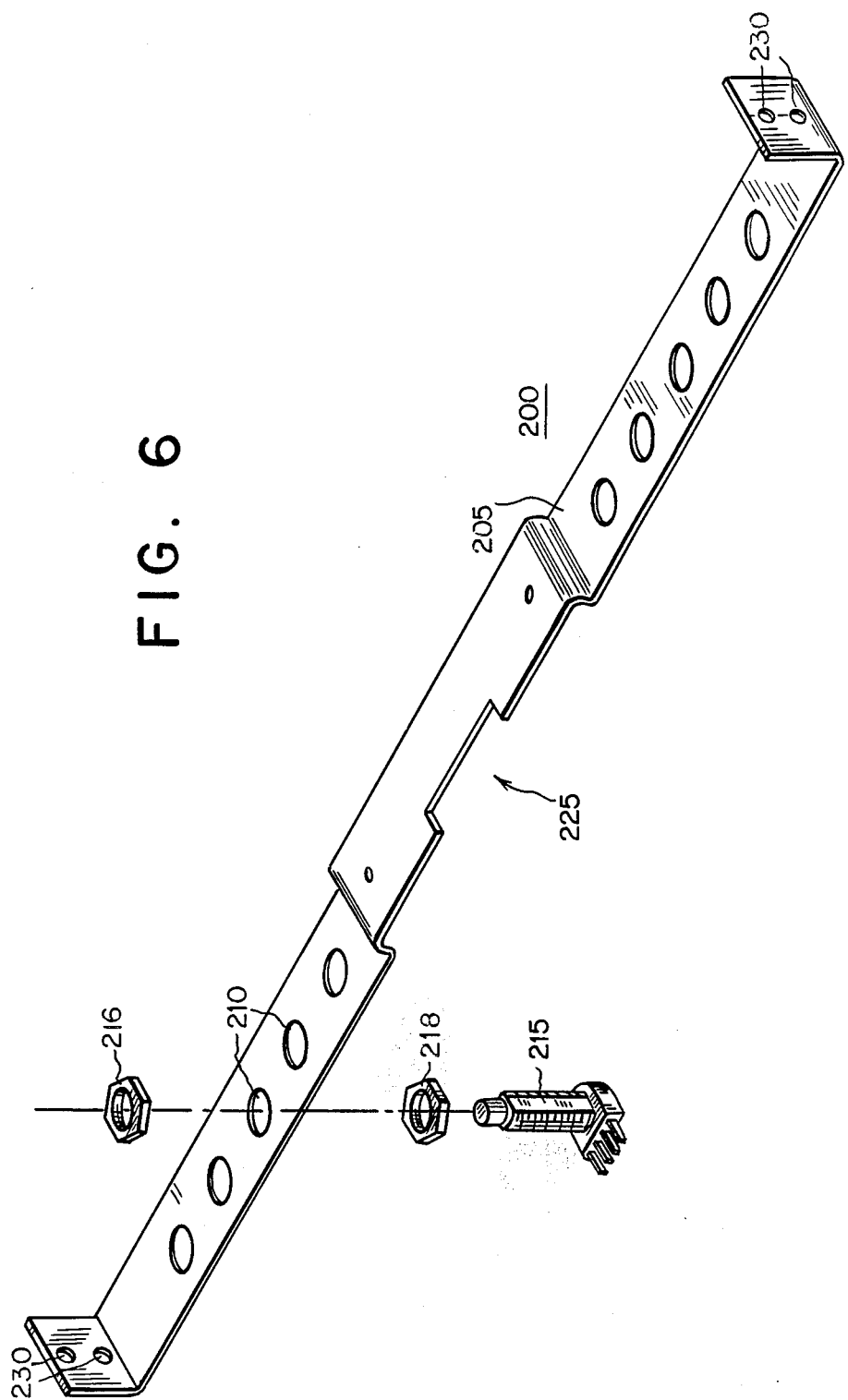
FIG. 6 is a perspective view of a mounting bracket to accommodate proximity switches for use in retrofitting the lower keyboard of FIG. 5.

FIG. 6 depicts a mounting bracket 200 to accommodate proximity switches for use in the lower keyboard of FIG. 5. Mounting bracket 200 comprises a planar surface 205 having a plurality of bores 210 therethrough to accommodate a plurality of proximity switches 215, such switches being of the type described in conjunction with FIGS. 1–4. Mounting bracket 200 is preferably of length approximately equal to the length of support bracket 128 of FIG. 5. Mounting bracket 200 is preferably provided to replace support bracket 128 and has notch 225 for proper mounting with respect to motor 142 (FIG. 5). Mounting bracket 200 is provided with four bores 230 to match the four bores in left side and right side brackets 102, 104 which are used to attach support bracket 128 (FIG. 5) to side brackets 102, 104 (FIG. 5). Proximity switches 215 are firmly attached to bracket 200 by proximity switch height adjustment nuts 216, 218 which also serve to adjust the height of the proximity switches relative to the movable keys.

FIG. 7 illustrates the presently preferred embodiment by a cross-sectional view along line 7—7 of the lower keyboard of FIG. 5 with support bracket 128 removed and replaced by the mounting bracket and proximity switch combination of FIG. 6, in which like elements are labelled similarly. Proximity switch height adjustment nuts 216, 218 hold proximity switch 215 firmly to mounting bracket 200 which is firmly attached to left side and right side brackets 102, 104. Nuts 216, 218 further serve to adjust the position of detecting face 10 of proximity switch 215 relative to the underside of metallic key support 114 in order to adjust the point of depression of the movable keys which engages and disengages the proximity switches.

In the practice of the invention, an operator inputs data by depressing the plastic key covering 116 of the movable key, thereby causing a portion of metallic key support 114 to move sufficiently close to detecting face 10 of proximity switch 215 such that the switch is engaged. Similarly, by releasing the key, said portion of metallic key support 114 is moved sufficiently away from the detecting face to disengage the proximity switch. When the desired number of digits have been entered, a control signal is sent (by means not shown) to motor 142 which causes rod 144 to rotate 45°–90°. Such rotation causes flat surface 146 of rod 144 to no longer face metallic key element 114, thereby providing the lock-out feature described in conjunction with FIG. 5 and preventing inadvertent operator input. Advantageously, four wires connected to the four terminals (not shown) of each mechanical switch 118 are easily plugged onto the corresponding four terminals of each proximity switch 215.

Figure 8:
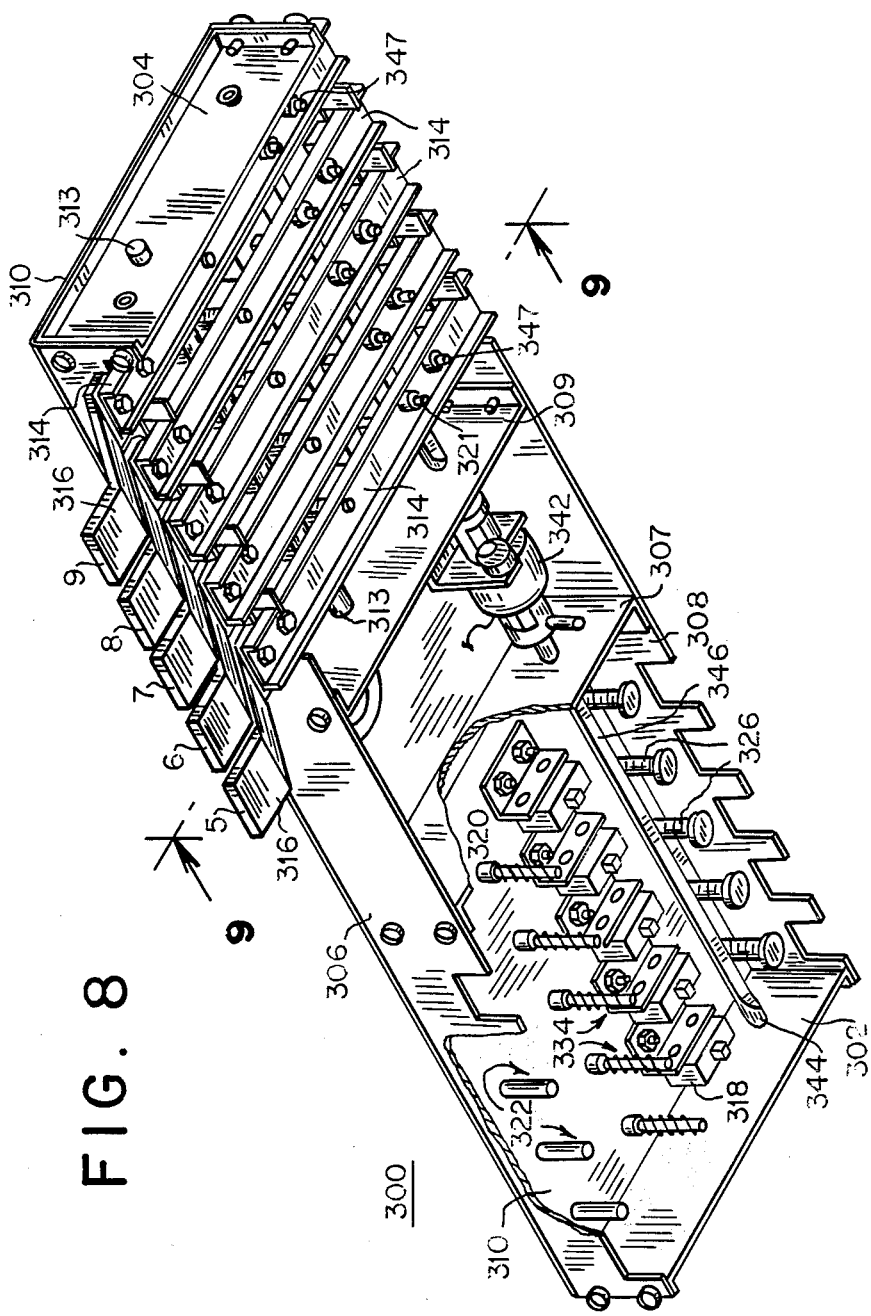
FIG. 8 is a bottom perspective view of a known prior art upper keyboard.

Referring to FIG. 8, a perspective view of the underside of a known upper keyboard 300 is shown comprising left side bracket 302, right side bracket 304, front bracket 306, rear bracket 308, center brackets 307, 309 and base housing 310. Movable keys 5–9 are pivotally attached to pivot rod 313 which is rigidly attached to brackets 304, 309; similarly, movable keys 0–4 (not shown) are pivotally attached to pivot rod 312 (not shown) which is rigidly attached to brackets 302, 307. Movable keys 0–9 each comprises a metallic key support 314 and a plastic key covering 316 attached to a front portion of the upper surface of metallic key support 314. Mechanical switches 318, similar to the mechanical switches 118 of the lower keyboard, are rigidly attached to base housing 310 by switch supports 320. Adjustment of contact position of mechanical switches 318 in order to alter the point of depression of the movable keys which engages mechanical switches 318 is accomplished through adjustment of set screws 321. Adjustment of set screws 322 mounted on base housing 310 serve to limit upward travel of the movable keys, while adjustment of set screws 326 also mounted on base housing 310 serve to limit downward travel of the movable keys. Spring assemblies 334 exert a force against metallic key supports 314 to provide for a normally upward position of the movable keys.

Lock-out mechanism 340 functions in a similar manner to lock-out mechanism 140 of FIG. 5. Lock-out mechanism 340 comprises motor 342 and rod 344. Rod 344 is provided with a semicircular cross section in a region proximate to and facing the top side of the movable keys. During normal operation of the keyboard, i.e., when an operator depresses keys in accordance with the ZIP code of a letter, a flat surface 346 of rod 344 faces the top side of the movable keys and serves to limit, by contacting adjustable set screws 347 on metallic key support 314, downward movement of the keys a maximum desired distance sufficient to actuate mechanical switches 318. Adjustable set screws 347 therefore limit a maximum downward position of the movable keys. Once the desired number of digits have been entered into the keyboard a control signal is sent (by means not shown) to motor 342 which rotates rod 344 approximately 45°–90°, thereby preventing or further limiting downward movement of the keys a desired distance insufficient to actuate mechanical switches 318 and thereby preventing inadvertent operator input. In a process wherein letters are sorted on the last two digits of the ZIP code, the lock-out mechanism will engage after two digits are entered into the keyboard(s). The lock-out mechanism will disengage upon removal of the sorted letter and delivery of a next letter to be sorted. Lock-out mechanisms 140, 340 may be engaged independently or simultaneously from entry of the desired number of digits into a single row of keys or both rows of keys.

FIG. 9 illustrates an alternate embodiment by a cross-sectional view along line 9—9 of the upper keyboard of FIG. 8 incorporating the proximity switch of FIG. 1, in which like elements are labelled similarly. Installation of the proximity switch of FIGS. 1–4 into base housing 310 of the upper keyboard of FIG. 8 is accomplished with minimum modification to the keyboard as follows: Set screws 326 are removed from base housing 310 and the resulting bore is enlarged to accommodate tubular shaft 20 of the proximity switch. Proximity switch height adjustment nuts 311, 317 hold the proximity switch firmly to base housing 310 and also serve to adjust the position of detecting face 10 of the proximity switch relative to the top side of metallic key support 314, in order to adjust the point of depression of the movable keys which engages and disengages the proximity switches. Advantageously, the four wires connected to the four terminals of each mechanical switch 318 are easily plugged onto the corresponding four terminals of each proximity switch.

In the practice of the invention, an operator inputs data by depressing plastic key covering 316 of the movable key, thereby causing a portion of metallic key support 314 to move sufficiently close to detecting face 10 of the proximity switch such that the switch is engaged. Similarly, by releasing the key, said portion of metallic key support 314 is moved sufficiently away from the detecting face to disengage the proximity switch. When the desired number of digits have been entered, a control signal is sent (by means not shown) to motor 342 which causes rod 344 to rotate 45°–90°. Such rotation causes flat surface 346 of rod 344 to no longer face metallic key element 314, thereby providing the lockout feature described in conjunction with FIG. 8 and preventing inadvertent operator input.

Mechanical switches 118, 318 in lower keyboard 100 and upper keyboard 300, respectively, are provided with positive and negative input terminals as well as normally open and normally closed output terminals. The proximity switch of FIG. 1 which may be fit into the lower keyboard of FIG. 5 and the upper keyboard of FIG. 8 with minimum modification to the keyboards similarly has such four terminals in order to provide for simple unplugging of the four wires attached to the four terminals of the mechanical switch and plugging said four wires into the corresponding four terminals of the proximity switch. However, since the electric phenomenon of "bounce" is not generally associated with the use of proximity switches, the need for a complementary output no longer exists. As a result, one skilled in the art will appreciate that a proximity switch having a single output may be adequate for existing MPLSM machines, provided that existing MPLSM software and/or hardware external to the keyboard can accept such an input, or such software and/or hardware is modified to accept such an input. Although no longer electrically functional once the proximity switches are installed, the mechanical switches are preferably not physically removed from the keyboard as they provide a beneficial feedback of touch sensitive "click" to the operator when a key is depressed. Alternatively, an audible and/or visual device may be coupled to an output of the proximity switch to similarly provide operator feedback. In such a case, a single audible device may be coupled to an output of each proximity switch by a diode.

Thus it can be seen that there is provided switching apparatus whereby switching is accomplished without the need for mechanical switches. In addition, it is to be understood that the invention can be carried out by specifically different equipment and devices and that various modifications, both as to equipment details and operating procedures can be effected without departing from the spirit and scope of the claimed invention.

More specifically, the claimed invention is not limited to dual type keyboards having an upper row of ten keys and a lower row of ten keys, nor is the proximity switch limited to complementary outputs. Additionally, the claimed invention may be used to input any portion of a ZIP code having any number of digits, address or the like.

What is claimed is:

1. A proximity switch for use in detecting position of an at least partially metallic movable key member of an operator controlled keyboard, said movable key member having a first normal position and a second depressed position in relation to said proximity switch, wherein said proximity switch is firmly attached to said keyboard and is provided with a positive direct current input terminal and a negative direct current input terminal.

2. The apparatus of claim 1 wherein a metallic portion of said movable key member is closer in position to a detecting face of said proximity switch in said second depressed position than in said first normal position.

3. The apparatus of claim 2 wherein said proximity switch is further provided with a complementary output comprising a normally open output terminal and a normally closed output terminal.

4. The apparatus of claim 3 wherein said proximity switch is provided with a logic high signal on said normally open output terminal and a logic low signal on said normally closed output terminal when said movable key member is in said first normal position.

5. The apparatus of claim 3 wherein said proximity switch is provided with a logic low signal on said normally open output terminal and a logic high signal on said normally closed output terminal when said movable key member is in said second depressed position.

6. The apparatus of claim 3 wherein said detecting face of said proximity switch is essentially planar and parallel to a plane formed by said positive input terminal, negative input terminal, normally open input terminal and normally closed output terminal, said detecting face being perpendicular to a direction of travel associated with movement of said movable key between said first normal position and said second depressed position.

7. The apparatus of claim 3 wherein reverse polarity protection is provided for said positive input terminal and said negative input terminal.

8. The apparatus of claim 1 wherein said proximity switch has a sensing range of approximately 1.5 mm to 2.5 mm.

9. A proximity switch for use in an operator controlled keyboard of a mail sorting machine for determining a position of an at least partially metallic movable key member, said movable key member having a first normal position and a second depressed position in relation to said proximity switch wherein said proximity switch is firmly attached to said keyboard, and is provided with a positive direct current input terminal and a negative direct current input terminal.

10. The apparatus of claim 9 wherein said proximity switch provides a first output corresponding to said first normal position and a second output corresponding to said second depressed position.

11. The apparatus of claim 9 wherein said proximity switch is provided with a positive direct current input terminal and a negative direct current input terminal.

12. A proximity switch retrofit for use in United States Postal Service letter sorting machines comprising a mounting bracket having a plurality of bores therethrough, and a proximity switch insertable into each of said plurality of bores, wherein said proximity switch detects variations in the position of a partially metallic movable key member of said letter sorting machine.

13. The apparatus of claim 12 wherein said proximity switch is provided with a positive input terminal, a negative input terminal, and a complementary output comprising a normally open output terminal and a normally closed output terminal.

14. The apparatus of claim 13 wherein said proximity switch associated with said movable key member is provided with a logic high signal on said normally open output terminal and a logic low signal on said normally closed output terminal when said movable key member is not depressed.

15. The apparatus of claim 13 wherein said proximity switch associated with said movable key member is provided with a logic low signal on said normally open output terminal and a logic high signal on said normally closed output terminal when said movable key member is depressed.

16. The apparatus of claim 12 wherein said plurality of movable key members is ten.

17. The apparatus of claim 16 wherein said ten movable key members are associated with ten numerical digits zero through nine.

18. The apparatus of claim 12 wherein said proximity switch has a sensing range of approximately 1.5 mm to 2.5 mm.

19. The apparatus of claim 13 wherein said positive input terminal and said negative input terminal are provided with direct current from said letter sorting machine.

20. In an operator controlled keyboard having a plurality of at least partially metallic movable keys and a mechanical switch associated with each of said movable keys wherein a first normal position of said movable key produces a first output of said mechanical switch and a second depressed position of said movable key produces a second output of said mechanical switch, the combination with said movable key of a proximity switch wherein said mechanical switch is electrically disconnected from said keyboard and said proximity switch is correspondingly electrically connected to said keyboard, and wherein said first normal position of said movable key produces a first output of said proximity switch and said second depressed position of said movable key produces a second output of said proximity switch.

21. The apparatus of claim 20 wherein said first output of said mechanical switch is approximately the same direct current voltage level as said first output of said proximity switch and said second output of said mechanical switch is approximately the same direct current voltage level as said second output of said proximity switch.

* * * * *